United States Patent
Ayers et al.

(10) Patent No.: US 8,576,578 B2
(45) Date of Patent: Nov. 5, 2013

(54) ROBUST POWER PLANE CONFIGURATION IN PRINTED CIRCUIT BOARDS

(75) Inventors: Robert L. Ayers, Durham, NC (US); Michael L. Scollard, Raleigh, NC (US); Heidi D. Williams, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 13/170,010

(22) Filed: Jun. 27, 2011

(65) Prior Publication Data

US 2012/0327583 A1   Dec. 27, 2012

(51) Int. Cl.
*H05K 1/11* (2006.01)
*H05K 1/14* (2006.01)

(52) U.S. Cl.
USPC ....... 361/794; 361/748; 361/799; 361/679.02

(58) Field of Classification Search
USPC .............. 361/748, 784, 792, 794, 795, 799, 361/679.01, 679.02, 679.31; 174/255, 257
See application file for complete search history.

(56) References Cited

U.S. PATENT DOCUMENTS

| | | | |
|---|---|---|---|
| 5,483,413 A * | 1/1996 | Babb | 361/220 |
| 5,500,789 A * | 3/1996 | Miller et al. | 361/816 |
| 6,353,540 B1 * | 3/2002 | Akiba et al. | 361/794 |
| 6,509,640 B1 | 1/2003 | Li et al. | |
| 6,559,484 B1 | 5/2003 | Li et al. | |
| 6,986,198 B2 | 1/2006 | Fallon et al. | |
| 2004/0016569 A1 | 1/2004 | Mix et al. | |
| 2005/0039947 A1 | 2/2005 | Ohsaka | |
| 2008/0173987 A1 | 7/2008 | Koshiishi et al. | |

OTHER PUBLICATIONS

Turbini et al., Conductive Anodic Filament (CAF) Formation: A Potential Reliability Problem for Fine-Line Circuits, Life Cycle Systems Engineering Workshop, Nov. 1997.
Smetana et al., Bare Board Material Performance after Pb-Free Reflow, IPC Apex, Mar.-Apr. 2009.
Brewin et al., Susceptibility of Glass—Reinforced Epoxy Laminates to Conductive Anodic Filamentation, ISSN 1473 2734, Jan. 2004.

* cited by examiner

*Primary Examiner* — Hoa C Nguyen
(74) *Attorney, Agent, or Firm* — Kunzler Law Group

(57) ABSTRACT

A robust printed circuit board (PCB) that includes at least two power layers that are used in providing power to components connected to the PCB. The power layers may be a power plane layer and a ground plane layer. The power plane layer is situated such that its edge is pulled back a second distance from the planar edge of the PCB. The ground plane layer is situated such that its edge is pulled back a first distance from the planar edge of the PCB. The second distance and the first distance are different, and as a result, the planar edges of the power plane layer and the ground plane layer respectively do not coincide.

20 Claims, 9 Drawing Sheets

ROBUST POWER PLANE CONFIGURATION IN PRINTED CIRCUIT BOARDS

FIELD

The subject matter disclosed herein relates to printed circuit boards (PCBs), and more particularly to power layer configurations within PCBs.

BACKGROUND

Printed circuit boards (PCBs) are important components in many computing systems. The PCB is often used to mechanically support and connect electronic components that connect to the PCB. The PCB may also provide electrical power to various electronic components that are integral to, or connected to, the PCB.

Many PCBs are made of various flat layers that are sandwiched together. In such multi-layered PCBs, there is usually a ground plane layer and a power plane layer. The ground plane layer is typically a layer of copper and acts as ground for the PCB, providing a reference voltage that is treated as zero volts. The power plane layer is used to provide power, typically direct current (DC) voltage that is used to power circuits mounted on the PCB. Components that need power, or a reference to ground, may connect to one or both of these planes, as necessary.

In the PCBs, the ground plane layer and the power plane layer usually extend out almost to the edges of the PCB. The edges of the ground plane layer and power plane layer are covered with a laminate that prevents the edges from being exposed. However, if the laminate is damaged and the edges of the ground plane layer and the power plane layer are exposed, the integrity of the PCB can be compromised. For example, humidity may create a conductive path between the exposed edge of the ground plane layer and the exposed edge of the power plane layer, resulting in failure. The exposure may result in the growth of conductive anodic filaments (CAFs) between the ground plane layer and the power plane layer, or other problems, which can cause failure. Failure of a PCB can render a system inoperative until the PCB is replaced. As a result, failure of a PCB can be a serious problem.

BRIEF SUMMARY

From the foregoing discussion, it should be apparent that a need exists for an apparatus, method, and system that provide a more robust PCB.

In one embodiment, the PCB includes a laminate layer that defines an outermost boundary for the PCB. The PCB may also include a ground plane layer that has a first voltage and a first planar boundary that is situated a first distance from the outermost planar boundary of the PCB.

The PCB may also include an insulation layer that is situated between the ground plane layer and a power plane layer of the PCB. The insulation layer has a first orthogonal thickness.

The PCB may also include the power plane layer having a second voltage of magnitude greater than the first voltage. The power plane layer may also have a second planar boundary situated a second distance, larger than the first distance, from the outermost planar boundary of the PCB. The difference between the first distance and the second distance may be at least twice the first orthogonal thickness.

In one embodiment, the invention includes a PCB having a planar edge, and a first power layer having a first voltage and a first planar edge situated a first distance from the planar edge of the PCB. The PCB may also include a second power layer having a second voltage and a second planar edge that is situated a second distance from the planar edge of the PCB. The second distance may be larger than the first distance, and the second voltage may be different than the first voltage.

In one embodiment, the invention may be realized as a computer system that includes a processor, a memory, and a PCB. The PCB may have a planar edge, a first power layer, and a second power layer. The first power lay may have a first voltage and a first planar edge situated a first distance from the planar edge of the PCB.

The second power layer may have a second voltage and a second planar edge that is situated a second distance from the planar edge of the PCB. The second distance may be larger than the first distance, and the second voltage may be different than the first voltage.

The invention may be realized as a method for making a PCB. The method may include making a planar edge of the PCB and inserting a first power layer in the PCB, the first power layer having a first voltage. The method may also include situating the first planar edge of the first power layer a first distance from the planar edge of the PCB.

The method may also include inserting a second power layer into the PCB. The second power layer may have a second voltage that is different than the first voltage. The method may further involve situating a second planar edge of the second power layer a second distance from the planar edge of the PCB, which second distance is larger than the first distance.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
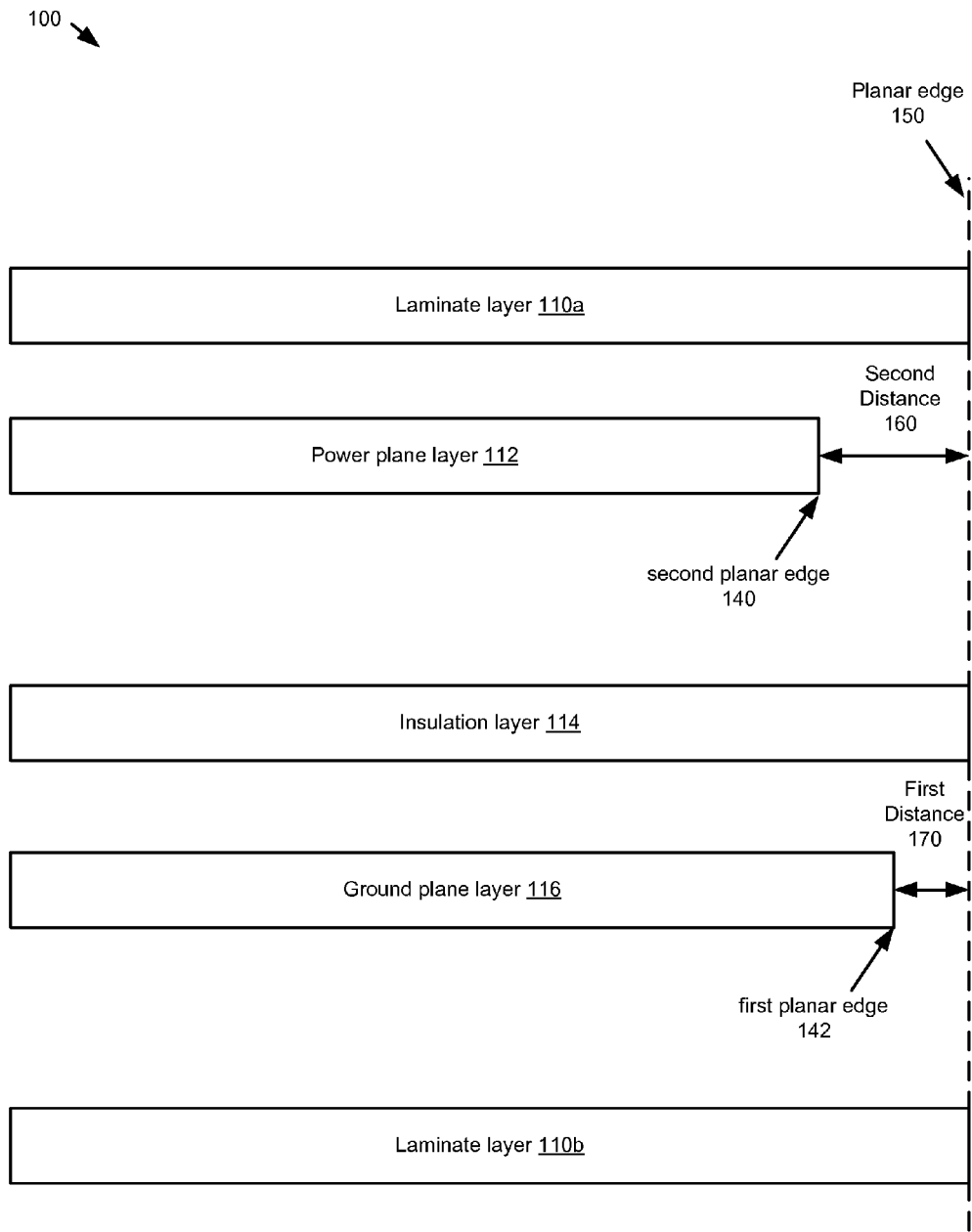
FIG. 1 is an exploded cross sectional view of one embodiment of a PCB having a power plane layer and a ground plane layer.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing.

In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the C programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer readable program code. These computer readable program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer readable program code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

FIG. 1 depicts an exploded view of a cross-section of one embodiment of a PCB 100. FIG. 1 depicts a laminate layer 110a that may be the top layer of the PCB 100. A laminate layer 110b may also be used for the bottom layer of the PCB 100. The PCB 100 may also include a power plane layer 112 and a ground plane layer 116 separated by an insulation layer 114. The PCB 100 may include other layers, components, and features, such as traces, which are not shown in FIG. 1.

The power plane layer 112 may be used to provide power to various components that are integral to, or that connect to, the PCB 100. The power plane layer 112 may be set to a voltage such as 12 volts. The power plane layer 112 also has a planar edge referred to as a second planar edge 140. The power plane layer 112 may be made from copper or other suitable material.

The ground plane layer 116 may be used to provide a reference voltage for the PCB 100 and components that are integral to, or that connect to, the PCB 100. The ground plane layer 116 also has a voltage that is the reference voltage and is treated as being 0 volts. The ground plane layer 116 also has a planar edge, referred to as the first planar edge 142. The ground plane layer 116 may be made out of copper or other suitable material.

The power plane layer 112 and the ground plane layer 116 are power layers in the PCB 100. As used in this application, "power layer" refers to a layer in the PCB 100 that is used to facilitate providing power to components that are integral to, or that are connected to, the PCB 100. A power plane layer 112 is a power layer that is set to a voltage and used to provide a regulated voltage for components connected to the PCB 100. For example, a power plane layer 112 may have a regulated direct current (DC) voltage of 12 volts that is used by components of the PCB 100. A ground plane layer 116 is a power layer that acts as a reference for components connected to the PCB 100.

FIG. 1 shows a planar edge 150 of the PCB 100. A planar edge 150 is an edge bisecting the planes of PCB 100. For example, a PCB 100 is typically wider and longer than it is thick, and includes various layers of sheets of materials that lie within a plane. The edges along the width and the length of the PCB 100 are the planar edges 150 as they bisect the plane in which the PCB 100 lies. The top and bottom of the PCB 100 are not planar edges 150 of the PCB 100. The planar edge 150 may be an outermost planar edge 150 that defines the outward extent of the PCB 100. The planar edge 150 may be an interior planar edge 150; for example, a mounting hole in the PCB 100 may define one or more interior planar edges 150.

A PCB 100 typically has more than one planar edge 150. A collection of planar edges 150 may define a planar boundary. For example, a rectangular PCB 100 will have four planar edges 150 that define the outermost planar boundary of the PCB 100. If the PCB 100 contains one or more mounting holes, the edges of the mounting holes define an interior planar boundary.

The power plane layer 112 and the ground plane layer 116 are separated in FIG. 1 by an insulation layer 114. The insulation layer 114 is made of a material suitable to preventing electrical contact between the power plane layer 112 and the ground plane layer 116 that may cause, for example, a short circuit. The insulation layer 114 may be fabricated from a suitable dielectric material, and be given sufficient thickness to provide proper electrical isolation.

The power plane layer 112 has a planar edge that is referred to as a second planar edge 140 in FIG. 1 to distinguish it from the other planar edges shown in FIG. 1. The edges along the width and the length of the power plane layer are second planar edges 140. The top and bottom of the power plane layer 112, which contact the laminate layer 110a and the insulation layer 114 respectively, are not second planar edges 140. The second planar edge 140 may be an interior planar edge; for example, a mounting hole in the PCB 100 may pass through the power plane layer 112 and for which the power plane layer 112 has one or more second planar edges 140.

The ground plane layer 116 has a planar edge that is referred as a first planar edge 142 to distinguish it from other planar edges shown in FIG. 1. As with the power plane layer 112, the ground plane layer 116 typically is a sheet with a length and width that is much larger than its thickness, and thus can be considered a lie within a plane. The planar edges along the width and length of the ground plane layer 116 are first planar edges 142, while the top and the bottom of the ground plane layer 116 are not planar edges. The first planar edge 142 may be an interior planar edge, or an outer planar edge.

The second planar edge 140 of the power plane layer 112 may be situated a second distance 160 from the planar edge 150 of the PCB 100. The first planar edge 142 of the ground plane layer 116 may be situated a first distance 170 from the planar edge 150 of the PCB 100. The second distance and the first distance are unequal, resulting in one of the power layers being farther back from the planar edge 150 than the other power layer.

For example, in one embodiment, the first distance 170 is approximately 20 mils, and the second distance 160 is approximately 40 mils. Having both the power plane layer 112 and the ground plane layer 116 pulled back from the planar edge 150 of the PCB 100 protects both of the power layers from being unintentionally exposed. Having one of the power layers pulled back even further (in the case of FIG. 1, the power plane layer 112) may make the PCB 100 even more robust by reducing the likelihood that both the power plane layer 112 and the ground plane layer 116 will be exposed in the event of damage to the PCB 100.

The terms "first" and "second" are used in this application to differentiate between two items. For example, since both the power plane layer 112 and the ground plane layer have planar edges, the terms "first" and "second" may be added to clarify which planar edge is being referenced. The terms do not require any temporal ordering of the planar edges or distances. A second planar edge 140 need not refer always to the planar edge of the power plane layer 112; it may also be used to refer to the planar edge of the ground plane layer 116. The context in which the term "second planar edge 140" is used will indicate which power layer is being discussed. Thus, a reference to a power layer having a first planar edge 142 may refer to a planar edge of a power plane layer 112 or a ground plane layer 116, depending on the context.

Figure 2:
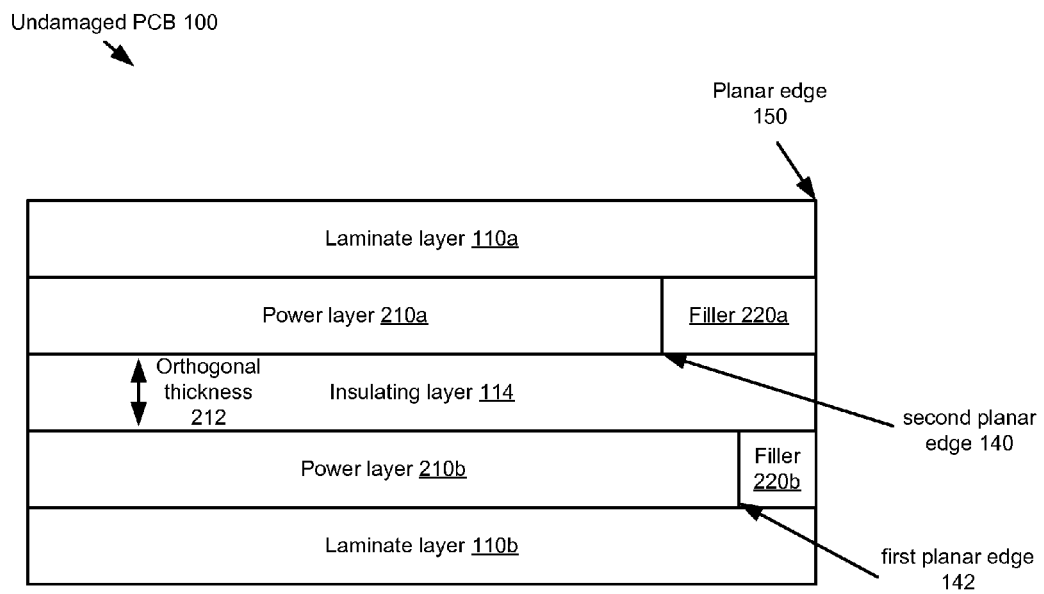
FIG. 2 is a cross sectional view of one embodiment of an undamaged PCB having two power layers.

FIG. 2 shows a cross section of one embodiment of an undamaged PCB 100. The PCB 100 includes two power layers labeled 210a and 210b. The power layer 210a may be a power plane layer 112 or a ground plane layer 116. Similarly, the power layer 210b may be a power plane layer 112 or a ground plane layer 116.

FIG. 2 also shows filler 220a and 220b that fill the gap between the planar edge 150 of the undamaged PCB 100 and the power layer 210a and the power player 210b respectively. The filler 220 may be a laminate or other suitable material for the planar edges 150 of the PCB 100. The filler 220 may ensure that the planar edge 150 of the PCB 100 is substantially smooth and keep the power layers 210 and other layers from being exposed.

FIG. 2 shows a second distance 160 between the second planar edge 140 of the power layer 210a and the planar edge 150 of the PCB 100 that is larger than the first distance 170 between the first planar edge 142 of the power layer 210b and the planar edge 150 of the PCB 100. FIG. 2 also shows an insulating layer 114 with an orthogonal thickness 212. Orthogonal thickness refers to the thickness of the material out of the plane of that material. In certain embodiments, the difference between the first distance 170 and the second distance 160 is larger than the first orthogonal thickness. The PCB 100 may be constructed such that the difference between the first distance 170 and the second distance 160 is at least twice the orthogonal thickness 212 of the insulating layer 114.

Figure 3:
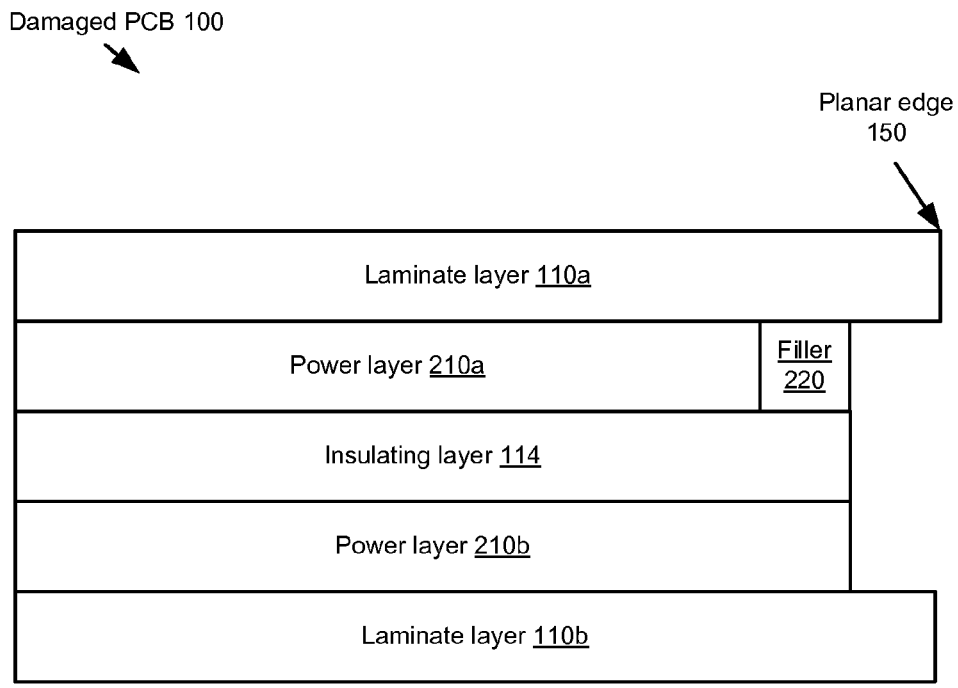
FIG. 3 is a cross sectional view of one embodiment of a damaged PCB having two power layers.

FIG. 3 shows one embodiment of a damaged PCB 100. In FIG. 3, the PCB 100 has been damaged such that the filler 220 between the power layer 210b and the planar edge 150 of the PCB 100 has been removed, leaving the power layer 210b exposed at that location. Because the power layer 210a is further recessed into the PCB 100, some filler 220 remains and prevents the power layer 210a from being exposed. This may reduce the possibility of CAFs (or other forms of damage) forming between the power layer 210b and the power layer 210a. Even if the filler 220 shown in FIG. 2 is removed by the damage, causing the power layer 210a to be exposed as well, the increased distance between the exposed planar edges of the power layer 210b and the power layer 210a may reduce the likelihood of failure due to CAF formation or unintentional shorting between the power layers 210a and 210b.

Figure 4:
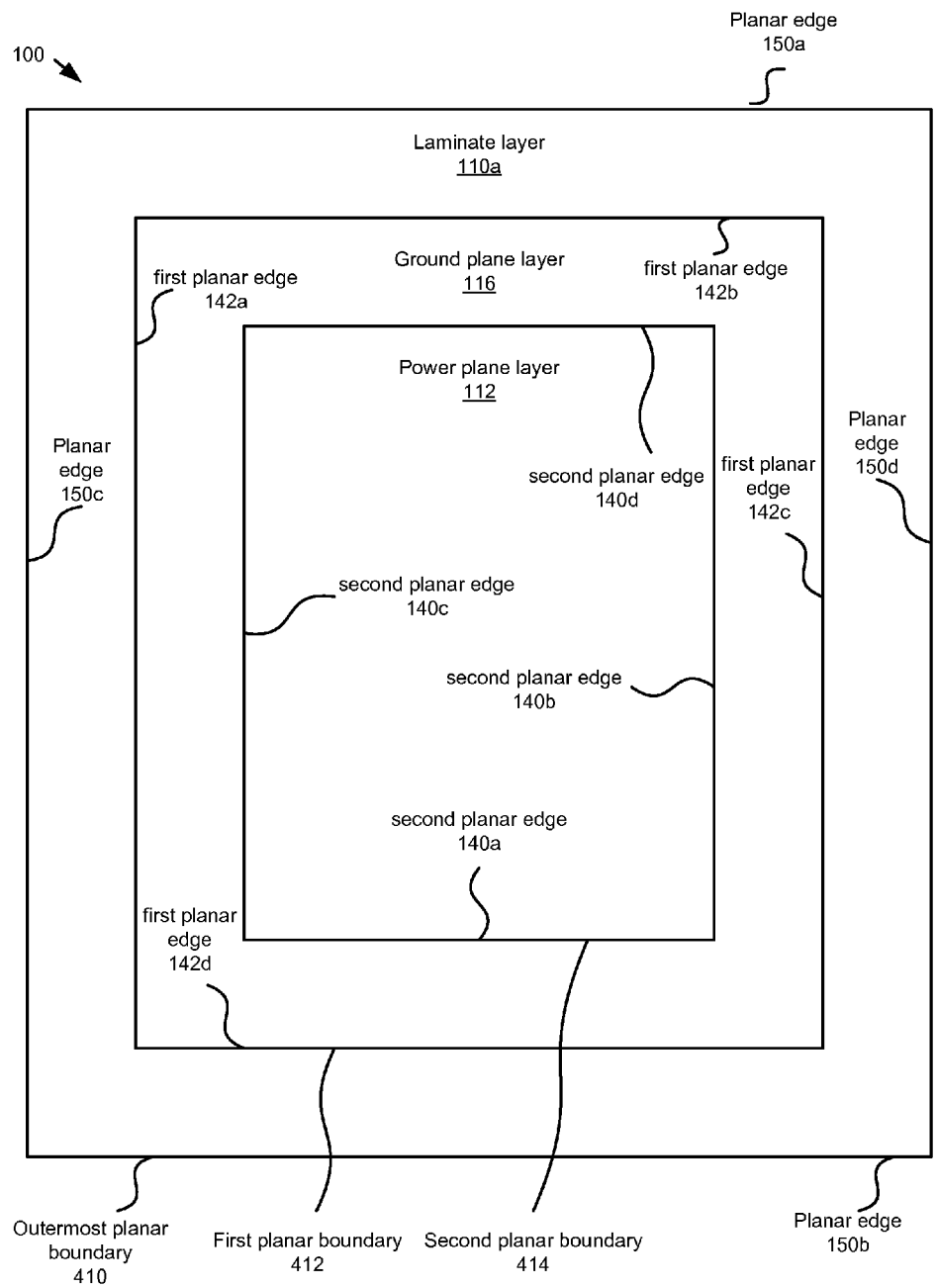
FIG. 4 is a top-down transparent view of one embodiment of a PCB having two power layers.

FIG. 4 shows a top down, transparent view of a PCB 100. In FIG. 4, the PCB 100 is rectangular. Those of skill in the art will appreciate that a PCB 100 may have many possible shapes, and that the present invention is not limited to any particular shape. The laminate layer 110a may be the top layer. The power plane layer 112 and the ground plane layer 116 may also be layered within the PCB 100. Other layers of the PCB 100 (such as an insulation layer 114) are not shown in FIG. 4 for ease of explanation and ease of illustration.

In FIG. 4, the laminate layer 110a has four planar edges 150a-d. These planar edges 150 define an outermost planar boundary 410 for the PCB 100 in FIG. 4. The ground plane layer 116 may also have four first planar edges 142*a-d*. These first planar edges 142 define a first planar boundary 412 for the ground plane layer 116. The power plane layer 112 may also have four second planar edges 140*a-d* that define a second planar boundary 414 for the power plane layer 112. While FIG. 4 depicts the laminate layer 110, the ground plane layer 116, and the power plane layer 112 as having four planar edges each, the number of planar edges may vary with the design of the PCB 100. In certain embodiments, the different layers may have different numbers of planar edges.

In one embodiment, the first planar boundary 412 of the ground plane layer 116 is situated the first distance from the outermost planar boundary 410 of the PCB 100 such that each first planar edge 142 is equidistant from its corresponding planar edge 150. The second planar boundary 414 of the power plane layer 112 may be situated the second distance from the outermost planar boundary 410 of the PCB 100 such that each second planar edge 140 is equidistance from its corresponding planar edge 150. In certain embodiments, the first and second distances may vary from planar edge 150 to planar edge 150.

Figure 5:
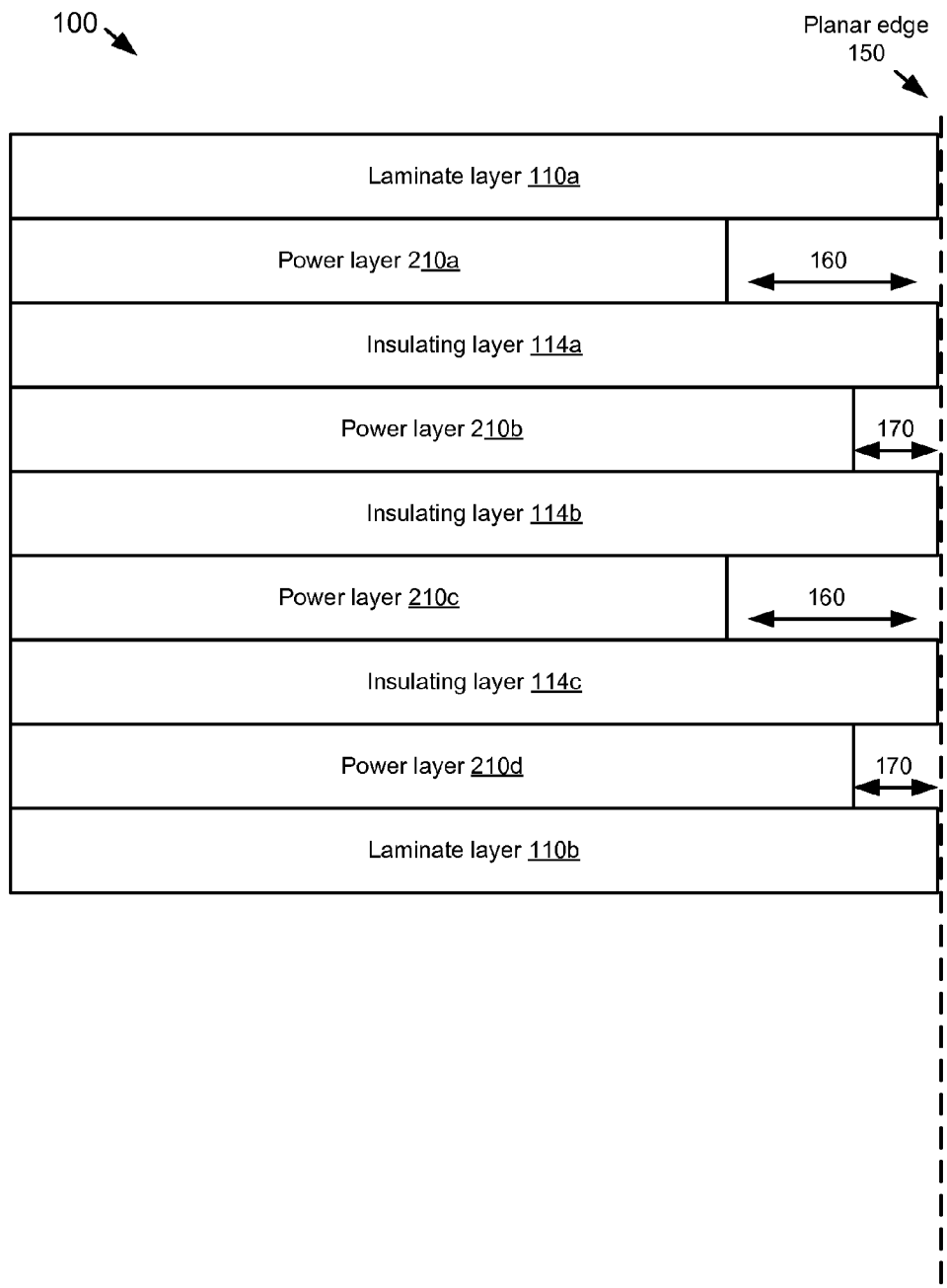
FIG. 5 is a cross sectional view of one embodiment of a PCB having multiple power layers.

FIG. 5 shows a cross sectional view of a PCB 100 with a plurality of power layers 210*a-c*. FIG. 5 does not show the filler 220. In certain embodiments, a PCB 100 may have multiple power layers 210. For example, the PCB 100 may have a power layer 210*a* that is a power plane layer 112 that provides a first voltage (such as 12 volts), a power layer 210*b* that is a power pane layer 112 that provides a second voltage (such as −3 volts), and a power layer 210*c* that is a ground plane layer 116 acting as a reference voltage for the PCB 100. The PCB 100 may include as many power layers 210 as are necessary for a particular system that the PCB 100 will be supporting.

In certain embodiments, each power layer 210 that is a power plane layer 112 is paired with a power layer 210 that is a ground plane layer 116. In such embodiments, the power plane layers 112 and the ground plane layers 116 may alternate in the PCB 100. Such an embodiment may be useful as the combination of the power plane layers 112 and the ground plane layers 116 may form a parallel plate capacitor that help filter the input signal from the power supply.

As seen in FIG. 5, the power layers 210 may be layered in the PCB 100 with alternating first and second distances 160 and 170 from the planar edge 150 of the PCB 100. For example, from the top, the power layer 210*a* may be a power plane layer 112 a second distance 160 from the planar edge 150. The power layer 210*b* may be a ground plane layer 116 a first distance 170 from the planar edge 150. The power layer 210*c* may be a power plane layer 112 a second distance 160 from the planar edge 150, while the power layer 210*d* may be a ground plane layer 116 a first distance from the planar edge 150. This pattern may continue for as many power layers 210 are in the PCB 100.

Figure 6A:
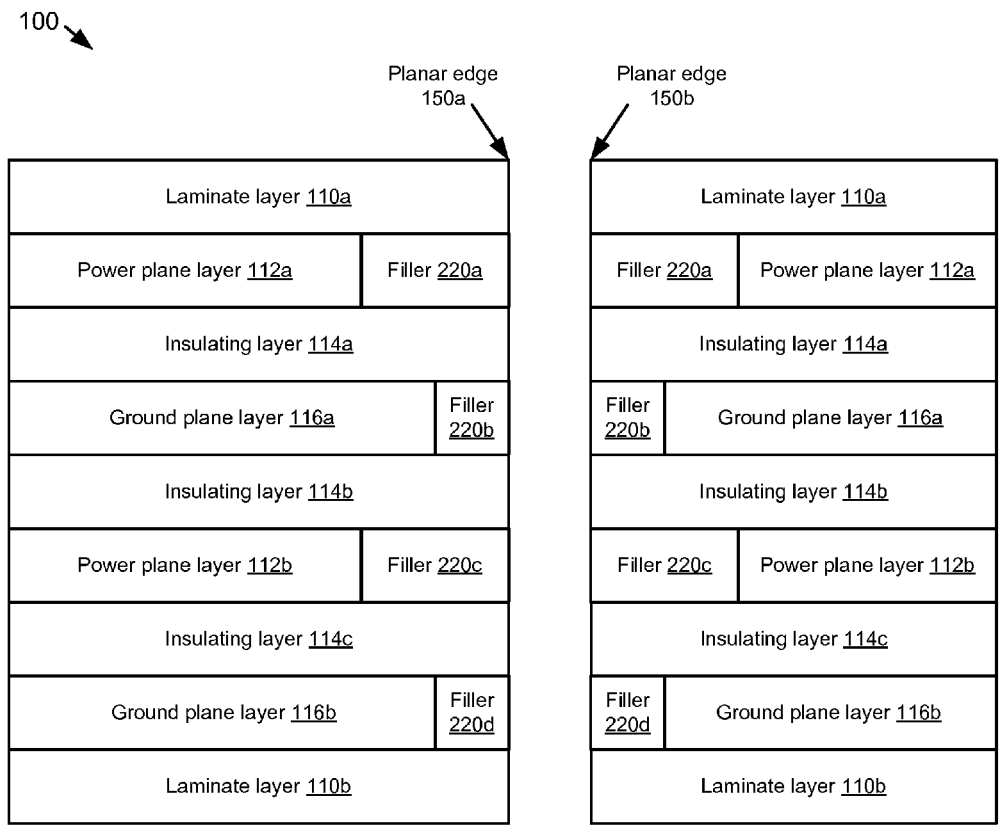
FIG. 6a is a cross sectional view of one embodiment of a PCB with interior planar edges.
Figure 6B:
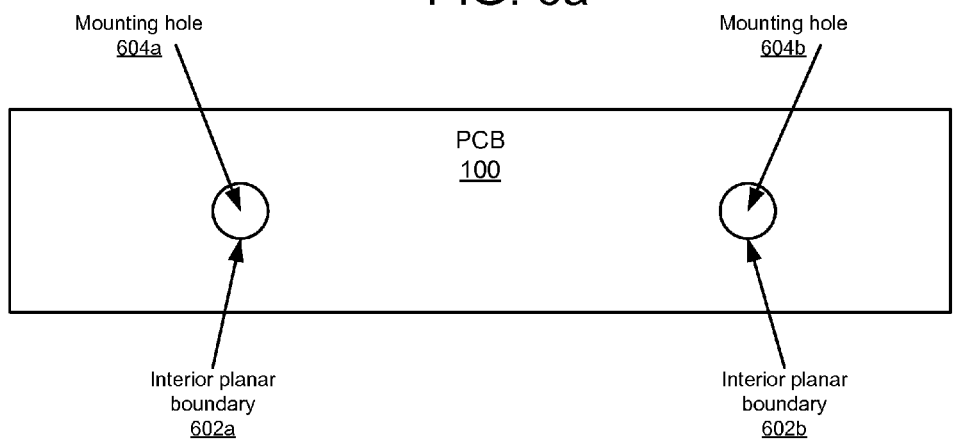
FIG. 6b is a top down view of one embodiment of a PCB with interior planar edges resulting from mounting holes through the PCB.

FIG. 6*a* shows a cross sectional view of one embodiment of a PCB 100 with interior planar edges 150*a-b*. FIG. 6*b* shows a top down view of the PCB 100 shown in FIG. 6*a*. The interior planar edges 150*a-b* may be the planar edges 150 of a mounting hole 604*a* or 604*b* shown in FIG. 6*b*. The interior planar edges 150*a-b* may define an interior planar boundary 602*a* for the PCB 100. The shape of the interior planar boundary 602*a* may vary, and is not necessarily circular as shown in FIG. 6*b*.

FIG. 6*a* shows multiple power layers 210 in the PCB 100; specifically, FIG. 6*a* shows power plane layers 112*a-b*, and ground plane layers 116*a-b*. The power plane layer 112*a* is separated a second distance 160 from the planar edge 150*a*, and the filler 220*a* fills the gap between the end of the power plane layer 112*a* and the planar edge 150*a*. In FIG. 6*a*, an identical arrangement exists for the power plane layer 112*a* on the opposite side, in connection with planar edge 150*b*.

An insulating layer 114*a* separates the power plane layer 112*a* from the ground plane layer 114*b*. In FIG. 6*a*, the ground plane layer 116*a* is a first distance 160 from the planar edge 150*a*, and the filler 220*b* fills the gap between the end of the ground plane layer 116*a* and the planar edge 150*a*. In FIG. 6*a*, an identical arrangement exists for the ground plane layer 116*a* on the opposite side, in connection with planar edge 150*b*.

FIG. 6*a* shows a PCB 100 with a plurality of power layers 210. In FIG. 6*a*, each of the power layers 210 is situated such that the distance between the edge of the power layer 210 and the planar edge 150 is different than the distance between the edge of the adjacent power layer and the planar edge of the PCB 100. As a result, the power layers 210 shown in FIG. 6*a* are staggered. In certain embodiments, the distances need not be the same; for example, the second distance 170 between the power plane layer 112*a* and the planar edge 150*a* need not be the same as the second distance 170 between the power plane layer 112*b* and the planar edge 150*a*. The actual distances may vary in implementation.

Figure 7A:
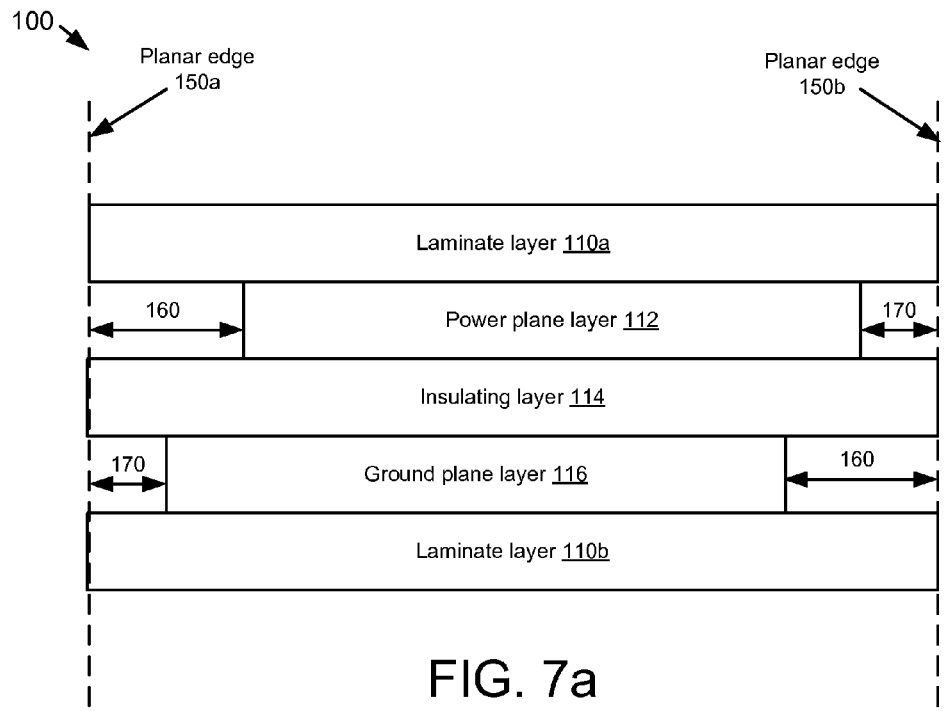
FIG. 7a is a cross sectional view of one embodiment of a PCB with two illustrated planar edges.

FIG. 7*a* shows an additional embodiment of a PCB 100 and shows two exterior planar edges 150*a* and 150*b*. In certain embodiments, the power plane layer 112 and the ground plane layer 116 are the same size, or approximately the same size, even though the power plane layer 112 and the ground plane layer 116 are different distances from the planar edges 150*a-b*.

In the embodiment shown in FIG. 7*a*, the power plane layer 112 and the ground plane layer 116 have the same length. The power plane layer 112 is situated within the PCB 100 such that the power plane layer 112 is the second distance 160 from the planar edge 150*a*, and the first distance 170 from the planar edge 150*b*. Similarly, the ground plane layer 116 may be situated within the PCB 100 such that the edge of the ground plane layer 116 is the first distance 170 from the planar edge 150*a* and the second distance 160 from the planar edge 150*b*. In this manner, the power plane layer 112 and the ground plane layer 116 may have comparable dimensions but still allow for appropriate offset from the planar edges 150*a* and 150*b* that provide additional robustness for the PCB 100.

While not shown in FIG. 7*a*, the PCB 100 may also include one or more mounting holes that create additional interior planar edges 150 within the PCB 100. As described above, the power plane layer 112 and the ground plane layer 116 may be sized and shaped to provide appropriate offsetting distances between the respective layers and the interior planar edges 150.

Figure 7B:
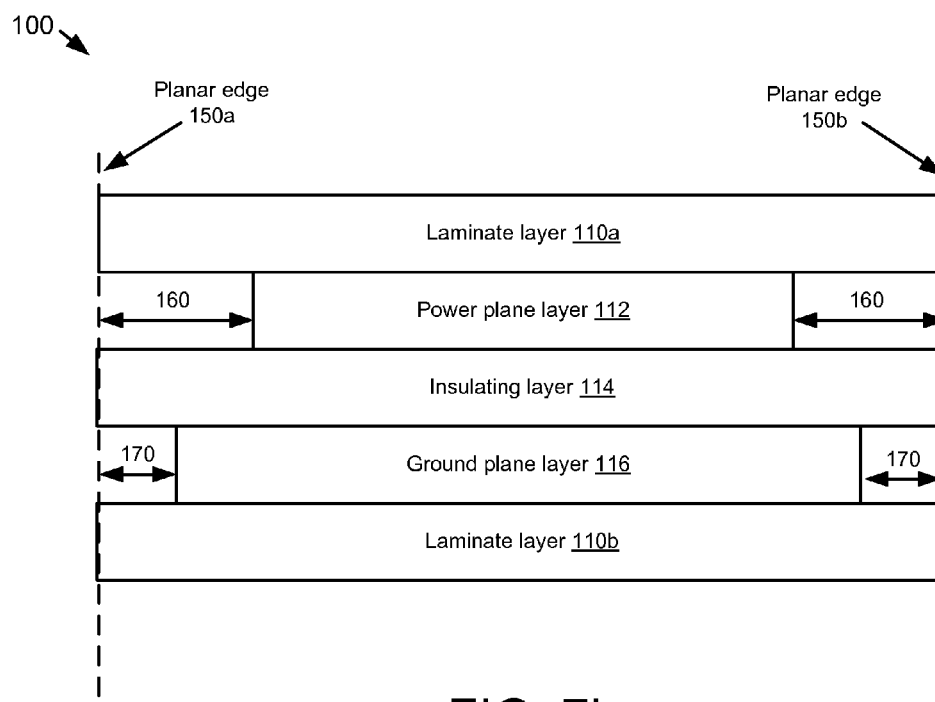
FIG. 7b is a cross sectional view of a second embodiment of a PCB with two illustrated planar edges.

In other embodiments, as shown in FIG. 7*b*, the power plane layer 112 and the ground plane layer 116 have substantially different dimensions. In one embodiment, the power plane layer 112 is sized such that it is the second distance 160 from both the planar edge 150*a*, and the planar edge 150*b*. The ground plane layer 116 may be sized such that it is the first distance 170 away from both the planar edge 150*a* and the planar edge 150*b*.

Figure 8:
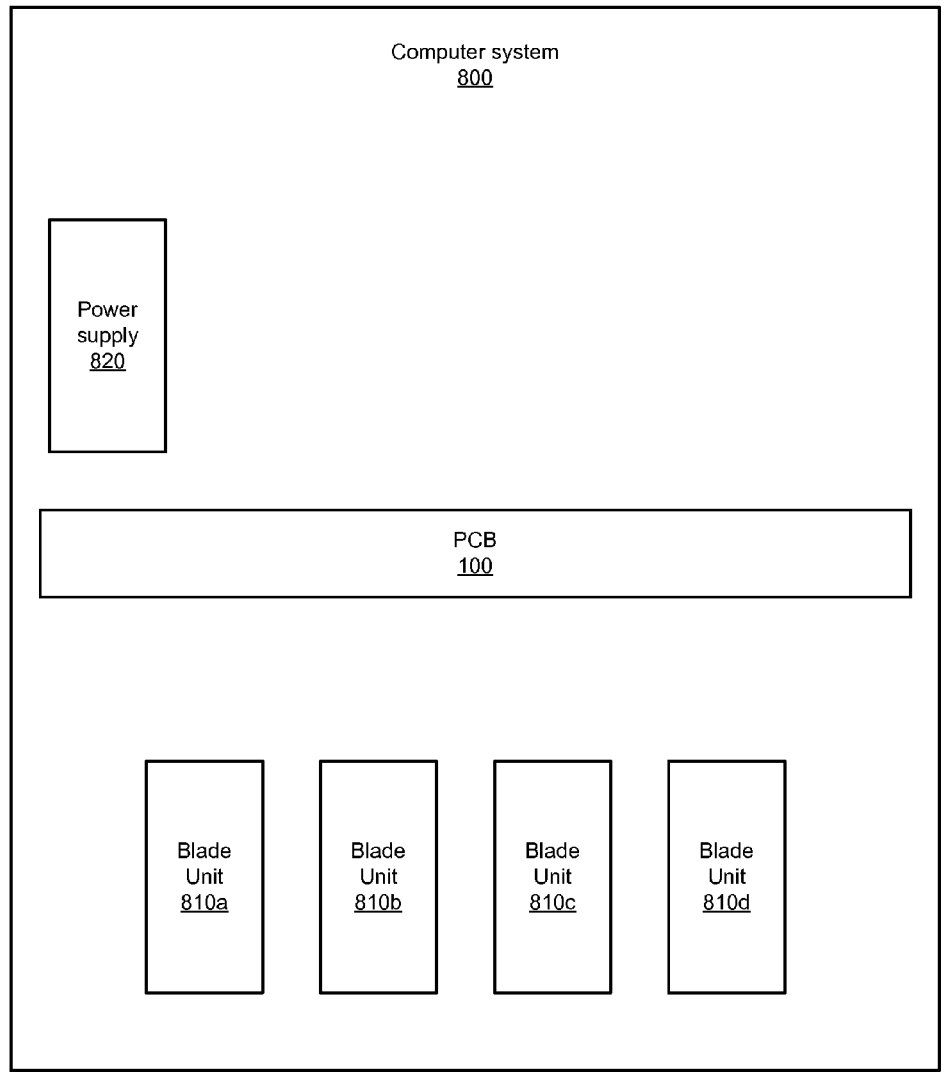
FIG. 8 is a schematic block diagram illustrating one embodiment of a computer system including a PCB.

FIG. 8 shows one embodiment of a computer system 800 in which the PCB 100 may be incorporated. In the depicted embodiment, the computer system 800 is a blade server system that includes blade units 810*a-d*. The blade units 810*a-d* may provide a variety of functions for the computer system 800. For example, the blade unit 810*a* may be configured to provide processing power, while the blade unit 810*b* is configured to provide storage for the computer system 800. The blade units 810*a-d* may be configured to connect to the PCB 100. The computer system 800 may use the blade units 810a-d to provide a processor and memory for the computer system 800. The computer system 800 may also include additional processors and memory in order to support the blade units 810a-d.

The PCB 100 in such a computer system 800 may provide, among other functions, power and connectivity between the blade units 810a-d. Such a PCB 100 may be referred to as a backplane, or a midplane, for the computer system 800. The PCB 100 includes a planar edge of the PCB 100. The PCB 100 also includes a first power layer 210 that has a first voltage, and a first planar edge 142 of the first power layer 210. The first voltage may be, for example, 3 volts. The first planar edge 142 of the first power layer 210 is situated a first distance 170 interior from the planar edge 150 of the PCB 100.

The PCB 100 also includes a second power layer 210. The second power layer 210 has a second voltage that is different from the first voltage. The second power layer 210 may be, for example, a ground plane layer 116 that has a voltage of 0 volts. The ground plane layer 116 may act as the reference point from which all other voltages are measured in the computer system 800. The second power layer 210 also has a planar edge, referred to as the second planar edge 140, which is situated a second distance 160 interior from the planar edge 150 of the PCB 100.

The computer system 800 also includes a power supply 820 that provides a power layer 210 that is a power plane layer 112 with its voltage. The computer system 800 may include one or more power supplies 820 to provide one or more voltages to the power plane layers 112 that are within the PCB 100. The power supply 820 may connect to an alternating current (AC) power source and convert the AC signal to a DC signal that is used by the PCB 100.

While FIG. 8 shows a computer system 800 that is a blade server system, the PCB 100 may be used in a variety of different computer systems 800. For example, the computer system 800 may be a personal computer. The computer system 800 may be a portable electronic device such as a laptop, a tablet, a phone, or other device.

Figure 9:
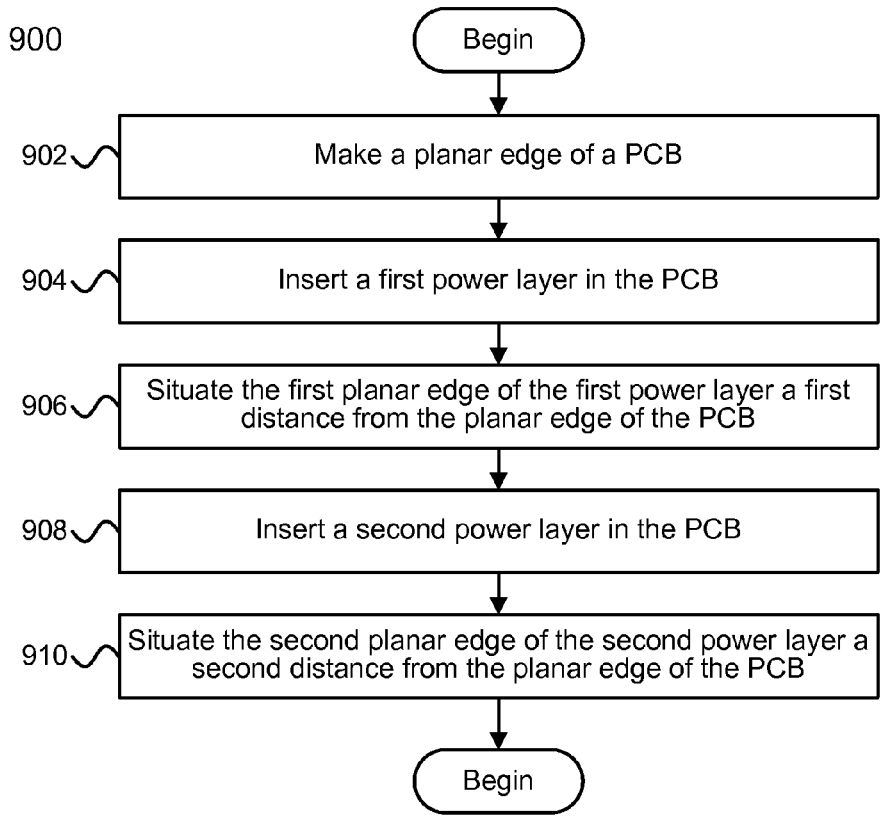
FIG. 9 is a schematic flow chart diagram illustrating one embodiment of a method for making a PCB.

FIG. 9 shows one embodiment of a method 900 for making a PCB 100. In one embodiment, the method 900 begins with making 902 a planar edge 150 of the PCB 100. Making the planar edge 150 of the PCB 100 may involve creating the laminate layer 110 that provides the outermost planar boundary 410 for the PCB 100.

The method 900 may also involve inserting 904 the first power layer 210 into the PCB 100. The first power layer 210 may be wired to connect to a power supply 820 and thus provide a first voltage through the first power layer 210.

The method 900 may further involve situating 906 the first planar edge 142 of the first power layer 210 a first distance 170 from the planar edge 150 of the PCB 100. The method 900 may involve repeating this step for each of the first planar edges 142 of the first power layer 210 such that each first planar edge 142 of the first power layer 210 is situated the first distance 170 from its corresponding planar edge 150 of the PCB 100.

The method 900 may also involve inserting 908 the second power layer 210 into the PCB 100. The second power layer 210 may also be connected to the power supply 820 to provide a second voltage through the second power layer 210. The second voltage may be a non-zero voltage that is different than the first voltage. The second voltage may be zero volts and act as ground.

The method 900 may further include situating 910 the second planar edge 140 of the second power layer 210 a second distance 160 from the planar edge 150 of the PCB 100.

As above, the method 900 may also involve repeating this step for each of the second planar edges 140 of the second power layer 210 such that each second planar edge 140 of the second power layer 210 is situated the second distance 160 from its corresponding planar edge 150 of the PCB 100. Other steps in addition to, or in place of, the steps shown in FIG. 9 may also be used in making a PCB 100.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes," "has," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A printed circuit board (PCB) comprising:
   a laminate layer defining an outermost planar boundary for the PCB;
   a ground plane layer having a first voltage and having a first planar boundary situated a first distance from the outermost planar boundary of the PCB;
   an insulation layer situated between the ground plane layer and a power plane layer, the insulation layer having a first orthogonal thickness; and
   the power plane layer having a second voltage of magnitude greater than the first voltage, and a second planar boundary situated a second distance, larger than the first distance, from the outermost planar boundary of the PCB, wherein a difference between the first distance and the second distance is at least twice the first orthogonal thickness,
   wherein from the first planar boundary to the outermost planar boundary of the PCB and from the second planar boundary to the outermost planar boundary of the PCB is filled with a filler that is non-conductive.

2. The PCB of claim 1, further comprising one or more additional power plane layers situated in the PCB with alternating first and second distances.

3. A printed circuit board (PCB) comprising:
a planar edge of the PCB, the planar edge of the PCB defining an outward extent of the PCB;
a first power layer having a first voltage and a first planar edge situated a first distance from the planar edge of the PCB; and
a second power layer having a second voltage and a second planar edge situated a second distance from the planar edge of the PCB, wherein the second distance is larger than the first distance, and wherein the second voltage is different than the first voltage,
wherein the PCB is non-conductive from the first planar edge to the planar edge of the PCB and from the second planar edge to the planar edge of the PCB.

4. The PCB of claim 3, further comprising an insulating layer situated between the first power layer and the second power layer, the insulating layer having a first orthogonal thickness.

5. The PCB of claim 4, wherein a difference between the first distance and the second distance is larger than the first orthogonal thickness.

6. The PCB of claim 5, wherein the difference between the first distance and the second distance is at least twice the first orthogonal thickness.

7. The PCB of claim 3, further comprising a plurality of additional power layers.

8. The PCB of claim 7, wherein each of the additional power layers is situated with a distance between the planar edge of the additional power layer and the planar edge of the PCB that is different than the distance between the planar edge of an adjacent power layer and the planar edge of the PCB, wherein the PCB is non-conductive from the planar edge of each additional power layer to the planar edge of the PCB.

9. The PCB of claim 8, wherein the power layers are layered in the PCB with alternating first and second distances.

10. The PCB of claim 3, wherein the planar edge is one of an interior planar edge and an exterior planar edge.

11. The PCB of claim 3, the PCB comprising a plurality of planar edges defining an outermost planar boundary for the PCB, the first power layer having a plurality of first planar edges defining a first outer planar boundary, the first outer planar boundary situated the first distance from the outermost planar boundary for the PCB, and the second power layer having a plurality of second planar edges defining a second outer planar boundary, the second outer planar boundary situated the second distance from the outermost planar boundary for the PCB, wherein the PCB is non-conductive from the first planar boundary to the outermost planar boundary of the PCB along the entire outermost planar boundary of the PCB and the PCB is non-conductive from the second planar boundary to the outermost planar boundary of the PCB along the entire outermost planar boundary of the PCB.

12. The PCB of claim 3, the PCB comprising a plurality of planar edges defining an interior planar boundary for the PCB, the first power layer having a plurality of first planar edges defining a first interior planar boundary, the first interior planar boundary situated the first distance from the interior planar boundary for the PCB, and the second power layer having a plurality of second planar edges defining a second interior planar boundary, the second interior planar boundary situated the second distance from the interior planar boundary for the PCB, wherein the PCB is non-conductive from the first interior planar boundary to the interior planar boundary for the PCB along the entire interior planar boundary for the PCB and the PCB is non-conductive from the second interior planar boundary to the interior planar boundary for the PCB along the entire interior planar boundary for the PCB.

13. The PCB of claim 3, wherein the first power layer is one of a ground plane layer and a power plane layer, and wherein the second power layer is one of a ground plane layer and a power plane layer.

14. A computer system comprising:
a processor;
a memory;
a printed circuit board (PCB) comprising:
a planar edge of the PCB, the planar edge of the PCB defining an outward extent of the PCB;
a first power layer having a first voltage and a first planar edge situated a first distance from the planar edge of the PCB; and
a second power layer having a second voltage and a second planar edge situated a second distance from the planar edge of the PCB, wherein the second distance is larger than the first distance, and wherein the second voltage is different than the first voltage,
wherein the PCB is non-conductive from the first planar edge to the planar edge of the PCB and from the second planar edge to the planar edge of the PCB.

15. The computer system of claim 14, further comprising a power supply providing the second voltage to the second power layer, wherein the second power layer is a power plane layer.

16. The computer system of claim 14, wherein the first power layer is a ground plane layer that is a reference point from which other voltages are measured in the computer system.

17. The computer system of claim 14, wherein the computer system is a blade server system.

18. The computer system of claim 17, wherein the PCB is a backplane for the blade server system.

19. The computer system of claim 14, wherein the computer system is a portable electronic device.

20. A method for making a printed circuit board (PCB) comprising:
making a planar edge of the PCB, the planar edge of the PCB defining an outward extent of the PCB;
inserting a first power layer in the PCB, the first power layer having a first voltage;
situating a first planar edge of the first power layer a first distance from the planar edge of the PCB;
inserting a second power layer in the PCB, the second power layer having a second voltage that is different than the first voltage; and
situating a second planar edge of the second power layer a second distance from the planar edge of the PCB, wherein the second distance is larger than the first distance
wherein the PCB is non-conductive from the first planar edge to the planar edge of the PCB and from the second planar edge to the planar edge of the PCB.

* * * * *